United States Patent
Sun et al.

(10) Patent No.: US 8,073,416 B2
(45) Date of Patent: Dec. 6, 2011

(54) METHOD AND APPARATUS FOR CONTROLLING A BIAS CURRENT OF A VCO IN A PHASE-LOCKED LOOP

(75) Inventors: Bo Sun, Carlsbad, CA (US); Gurkanwal Singh Sahota, San Diego, CA (US); Yue Wu, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 839 days.

(21) Appl. No.: 11/924,318

(22) Filed: Oct. 25, 2007

(65) Prior Publication Data

US 2009/0111409 A1 Apr. 30, 2009

(51) Int. Cl.
*H04B 7/00* (2006.01)
*H04B 1/40* (2006.01)

(52) U.S. Cl. .......................... 455/260; 455/257; 331/18

(58) Field of Classification Search .................. 455/230, 455/255–266; 331/16, 17, 18, 179, 177 R
See application file for complete search history.

(56) References Cited

U.S. PATENT DOCUMENTS

| | | | |
|---|---|---|---|
| 5,175,884 A * | 12/1992 | Suarez | 455/260 |
| 5,894,246 A | 4/1999 | Barnett et al. | |
| 6,163,184 A * | 12/2000 | Larsson | 327/156 |
| 7,068,989 B2 | 6/2006 | Yonekura | |
| 7,116,183 B2 | 10/2006 | Wu | |
| 7,149,914 B1 * | 12/2006 | Asaduzzaman et al. | 713/500 |
| 7,151,915 B2 | 12/2006 | Heinonen et al. | |
| 2008/0039042 A1 * | 2/2008 | Ciccarelli et al. | 455/234.1 |
| 2009/0072912 A1 * | 3/2009 | Kim et al. | 331/16 |

FOREIGN PATENT DOCUMENTS

WO 2006055792 5/2006

OTHER PUBLICATIONS

Partial International Search—PCT/US08/081033, International Search Authority—European Patent Office—Jan. 5, 2009.
International Search Report and Written Opinion—PCT/US2008/081033, International Search Authority— European Patent Office—Jun. 8, 2009.

\* cited by examiner

*Primary Examiner* — Blane J Jackson
(74) *Attorney, Agent, or Firm* — Larry J. Moskowitz (57) ABSTRACT

A local oscillator includes a phase-locked loop. The phase-locked loop includes voltage controlled oscillator (VCO) and a novel VCO control circuit. The VCO control circuit may be programmable and configurable. In one example, an instruction is received onto the VCO control circuit to change the power state of the VCO. The instruction is issued by other circuitry in response to a detected change in RF channel conditions (for example, a change in a signal-to-noise determination) in a cellular telephone. In response, the VCO control circuit outputs control signals that gradually widen the loop bandwidth of the PLL, then gradually change the VCO bias current to change the VCO power state, and then narrow the loop bandwidth of the PLL back to its original bandwidth. The entire process of widening the PLL bandwidth, changing the VCO power state, and narrowing the PLL bandwidth occurs while the PLL remains locked.

39 Claims, 5 Drawing Sheets

IDEALIZED VCO RESPONSE FOR
CONSTANT VCO INPUT VOLTAGE

FIG. 6

GRADUALLY CHANGE I1 SO THAT PLL STAYS IN LOCK
WHILE THE VCO POWER STATE IS CHANGED

METHOD AND APPARATUS FOR CONTROLLING A BIAS CURRENT OF A VCO IN A PHASE-LOCKED LOOP

BACKGROUND INFORMATION

1. Technical Field

The disclosed embodiments relate to local oscillators, and more particularly to local oscillators in RF communication devices.

2. Background Information

RF communication devices such as cellular telephones generally employ local oscillators. The receiver circuitry of a cellular telephone may, for example, employ a first local oscillator to generate a first reference signal of a specific frequency. The frequency of the first reference signal is changed in order to tune the receiver of the cellular telephone to a desired operating frequency or to change operating frequency bands. Similarly, the transmitter circuitry of the cellular telephone may employ a second local oscillator to generate a second reference signal of a specific frequency. The frequency of the second reference signal is changed in order to set the transmitting frequency with which the cellular telephone transmits.

A circuit called a phase-locked loop (PLL) is often used realize such local oscillators within cellular telephones. Within the control loop of the PLL, a voltage controlled oscillator (VCO) generates a signal whose frequency is determined by a voltage signal supplied to the VCO. The quality of the signal output by the VCO generally varies depending on certain factors including the size of the components that make up the VCO and the power consumption of the VCO. For example, if the VCO is operated at a higher power then the VCO may introduce less phase noise into the VCO output signal. If, on the other hand, the VCO is operated at a lower power then VCO may introduce more phase noise into the VCO output signal.

The amount of phase noise that is tolerable is not constant but rather varies depending on a number of factors. If the cellular telephone receiver is operating in an environment that has a source of interference that is close in frequency to a signal to be received, then the receiver requires that the VCO output signal have less phase noise. If there is no interference source, then the requirements on VCO output signal quality are relaxed. In a Wideband Code Division Multiple Access (WCDMA) communication system, for example, the cellular telephone may be receiving at the same time that it is transmitting. To prevent the signal being transmitted from interfering with the signal being received, a receiver VCO output signal having low phase noise is required. In other operating modes of the WCDMA system in which the transmitter is not on, it is acceptable for the receiver VCO output signal to have more phase noise. When no strong interference sources are present, a lower quality VCO output signal may be adequate.

The VCO circuits within a cellular telephone may consume a considerable amount of power. In a mobile communication device such as a cellular telephone, extending the amount of time that the cellular telephone can operate on a single battery charge is desirable. U.S. Pat. No. 7,151,915 discloses determining a signal-to-noise ratio (SNR) of a signal being received onto an RF communication device. If the SNR is found to exceed a threshold, then the bias voltage supplied to the receiver's VCO is reduced such that the VCO is set into in a lower power consumption mode. If, however, the SNR is found to be degrading over time, then the bias voltage supplied to the receiver's VCO is increased and the VCO is operated in a higher power consumption mode. Accordingly, VCO power consumption is set at or near its lowest acceptable level for detected RF channel conditions.

SUMMARY

A local oscillator includes a phase-locked loop. The phase-locked loop includes a voltage controlled oscillator (VCO) and a novel VCO control circuit. The voltage control circuit may be realized as a digital state machine, as a digital processor that executes instructions, as an analog circuit, or as a combination of the above. In one novel aspect, an instruction is received onto the VCO control circuit to change the power state of the VCO. The instruction may be issued by other circuitry in response to a detected change in RF channel conditions (for example, a change in a signal-to-noise determination).

In response to receiving the instruction, the VCO control circuit outputs control signals that gradually widen the loop bandwidth of the PLL. Once the loop bandwidth of the PLL has been widened, the VCO control circuit gradually changes a VCO bias current supplied to the VCO and thereby changes the power state of the VCO. In one example, the power consumption of the VCO is increased. In another example, the power consumption of the VCO is decreased. Once the VCO power state has been changed, the VCO control circuit gradually narrows the loop bandwidth of the PLL back to its original bandwidth. The entire process of widening the PLL loop bandwidth, changing the VCO power state, and narrowing the PLL loop bandwidth occurs while the PLL remains locked.

In some examples, the impetus for changing the power state of the VCO is not an instruction received onto the VCO control circuit, but rather the impetus is the VCO input voltage being either below a minimum lower limit or above a maximum upper limit. If the VCO input voltage is detected to be outside one of these limits, then the VCO control circuit changes the VCO power state to move the VCO input voltage towards or to a center of an operating range of the VCO input signal voltage. The VCO power state is changed while maintaining the PLL in lock. The PLL loop bandwidth is gradually widened, the VCO power is gradually changed in order to center the VCO input voltage, and the PLL loop bandwidth is gradually narrowed back to its original bandwidth.

In one example, the VCO is characterized over temperature to determine how the frequency of the VCO output signal changes as a function of temperature, how the VCO output signal changes as a function of a supply voltage, and how the VCO output signal changes as a function of VCO bias current. In operation, the VCO control signal adjusts the VCO bias current in order to compensate for detected temperature changes and detected supply voltage changes.

The foregoing is a summary and thus contains, by necessity, simplifications, generalizations and omissions of detail; consequently, those skilled in the art will appreciate that the summary is illustrative only and does not purport to be limiting. Other aspects, inventive features, and advantages of the devices and/or processes described herein, as defined solely by the claims, will become apparent in the non-limiting detailed description set forth herein.

DETAILED DESCRIPTION

Figure 1:
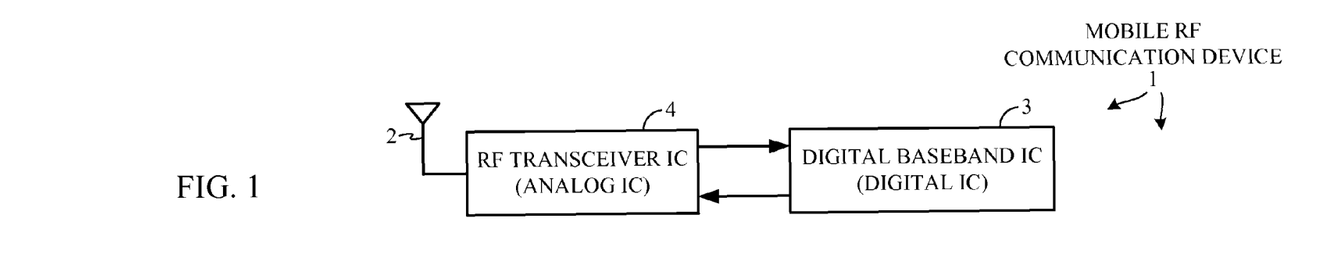
FIG. 1 is a high level block diagram of a mobile communication device in accordance with one novel aspect.

FIG. 1 is a very simplified high level block diagram of one particular type of mobile communication device 1 in accordance with one novel aspect. In this example, mobile communication device 1 is a 3-D cellular telephone that uses the WCDMA cellular telephone communication protocol. The cellular telephone includes (among several other parts not illustrated) an antenna 2 and two integrated circuits 3 and 4. Integrated circuit 3 is called a "digital baseband integrated circuit" or a "baseband processor integrated circuit". Integrated circuit 4 is an RF transceiver integrated circuit. RF transceiver integrated circuit 4 is called a "transceiver" because it includes a transmitter as well as a receiver.

Figure 2:
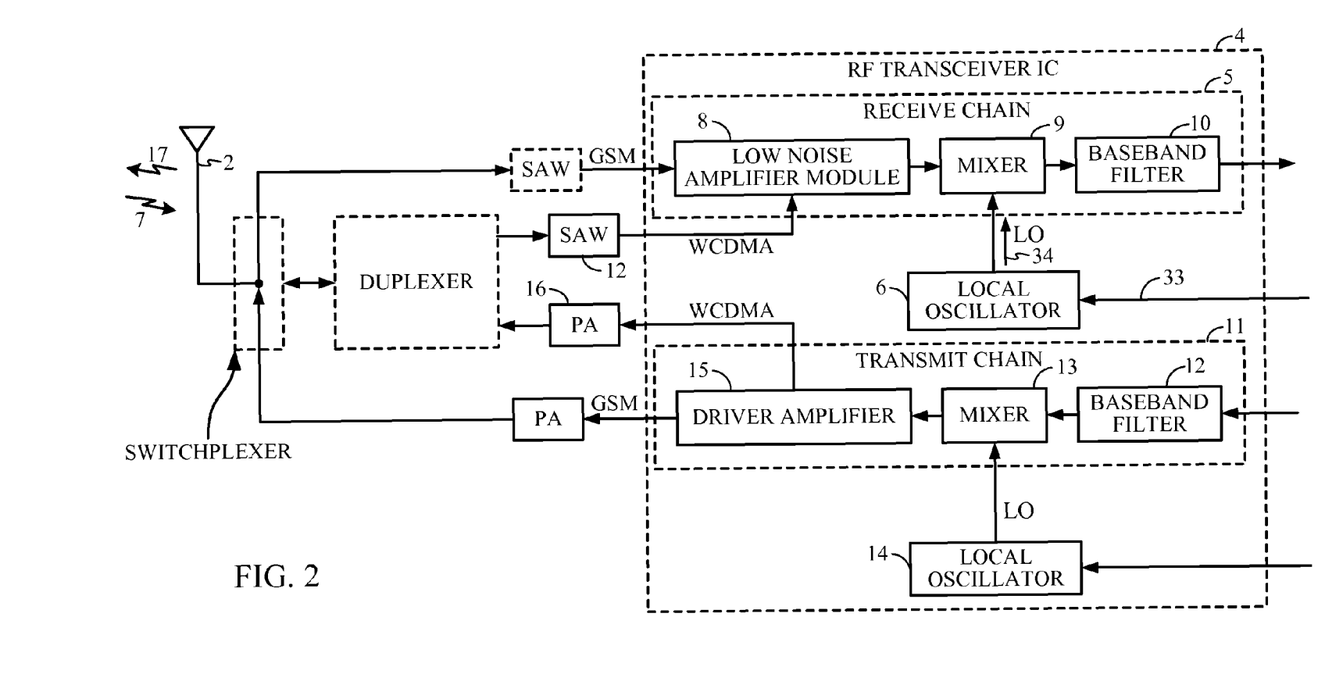
FIG. 2 is a more detailed block diagram of the RF transceiver integrated circuit 4 within the mobile communication device of FIG. 1.

FIG. 2 is a more detailed block diagram of the RF transceiver integrated circuit 4 of FIG. 1. The receiver includes what is called a "receive chain" 5 as well as a local oscillator (LO) 6. When the cellular telephone is receiving, a high frequency RF signal 7 is received on antenna 2. Information from signal 7 passes through the receive chain 5. Signal 7 is amplified by low noise amplifier 8 and is down-converted in frequency by mixer 9. The resulting down-converted signal is filtered by baseband filter 10 and is passed to the digital baseband integrated circuit 3. An analog-to-digital converter in the digital baseband integrated circuit 3 converts the signal into digital form and the resulting digital information is processed by digital circuitry in the digital baseband integrated circuit 3. The digital baseband integrated circuit 3 tunes the receiver by controlling the frequency of the local oscillator signal (LO) 34 supplied by local oscillator 6 to mixer 9.

If the cellular telephone is transmitting, then information to be transmitted is converted into analog form by a digital-to-analog converter in the digital baseband integrated circuit 3 and is supplied to a "transmit chain" 11. Baseband filter 12 filters out noise due to the digital-to-analog conversion process. Mixer block 13 under control of local oscillator 14 then up-converts the signal into a high frequency signal. Driver amplifier 15 and an external power amplifier 16 amplify the high frequency signal to drive antenna 2 so that a high frequency RF signal 17 is transmitted from antenna 2.

Figure 3:
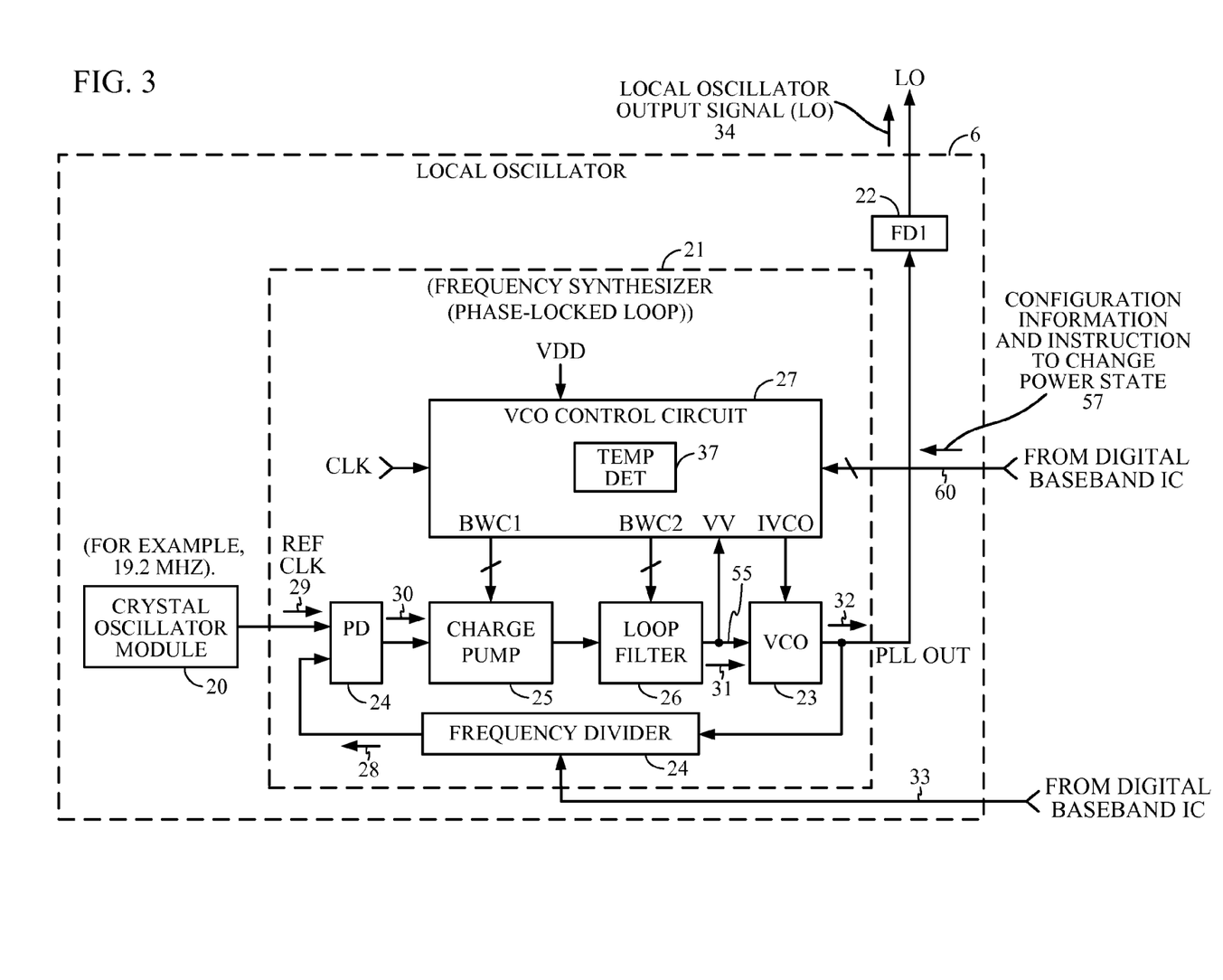
FIG. 3 is a more detailed diagram of the local oscillator 6 within the RF transceiver integrated circuit 4 of FIG. 2.

FIG. 3 is a more detailed block diagram of local oscillator 6 of the receiver of FIG. 2. Local oscillator 14 of the transmitter has an identical construction.

Local oscillator 6 includes a crystal oscillator module 20, a phase-locked loop (PLL) 21, and a frequency divider 22. Phase-locked loop 21 is sometimes referred to as a frequency synthesizer. Phase-locked loop 21 includes a voltage controlled oscillator (VCO) 23, a phase detector 24, a charge pump 25, a loop filter 26, a frequency divider 24, and a novel VCO control circuit 27. PLL 21 operates by comparing the phase of the signal 28 output by frequency divider 24 and the reference signal REF CLK 29 output by crystal oscillator module 20. The signal 30 output from phase detector 24 is indicative of the phase difference. Charge pump 25 and loop filter 26 operate to convert signal 30 into a control voltage VV signal 31 on input lead 55 of VCO 23. The control voltage signal VV controls the frequency of the PLL OUT signal 32 that is output by the VCO 23. The frequency of the signal PLL OUT 32 is divided by frequency divider 24 to generate the feedback signal 28. When PLL 21 is locked, the frequency of the PLL OUT signal 32 is a multiple of the REF CLK signal 29, and this multiple is determined by the number by which frequency divider 24 divides. Digital baseband integrated circuit 3 controls the frequency of PLL OUT by controlling the number by which frequency divider 24 divides. Digital baseband integrated circuit 3 communicates control information to RF transceiver integrated circuit 4 and this control information is communicated via control lines 33 to frequency divider 24 so as to change the number. The PLL OUT signal 32 is reduced in frequency by a fixed amount by frequency divider 22. The output of frequency divider 22 is the local oscillator output signal (LO) 34.

Figure 4:
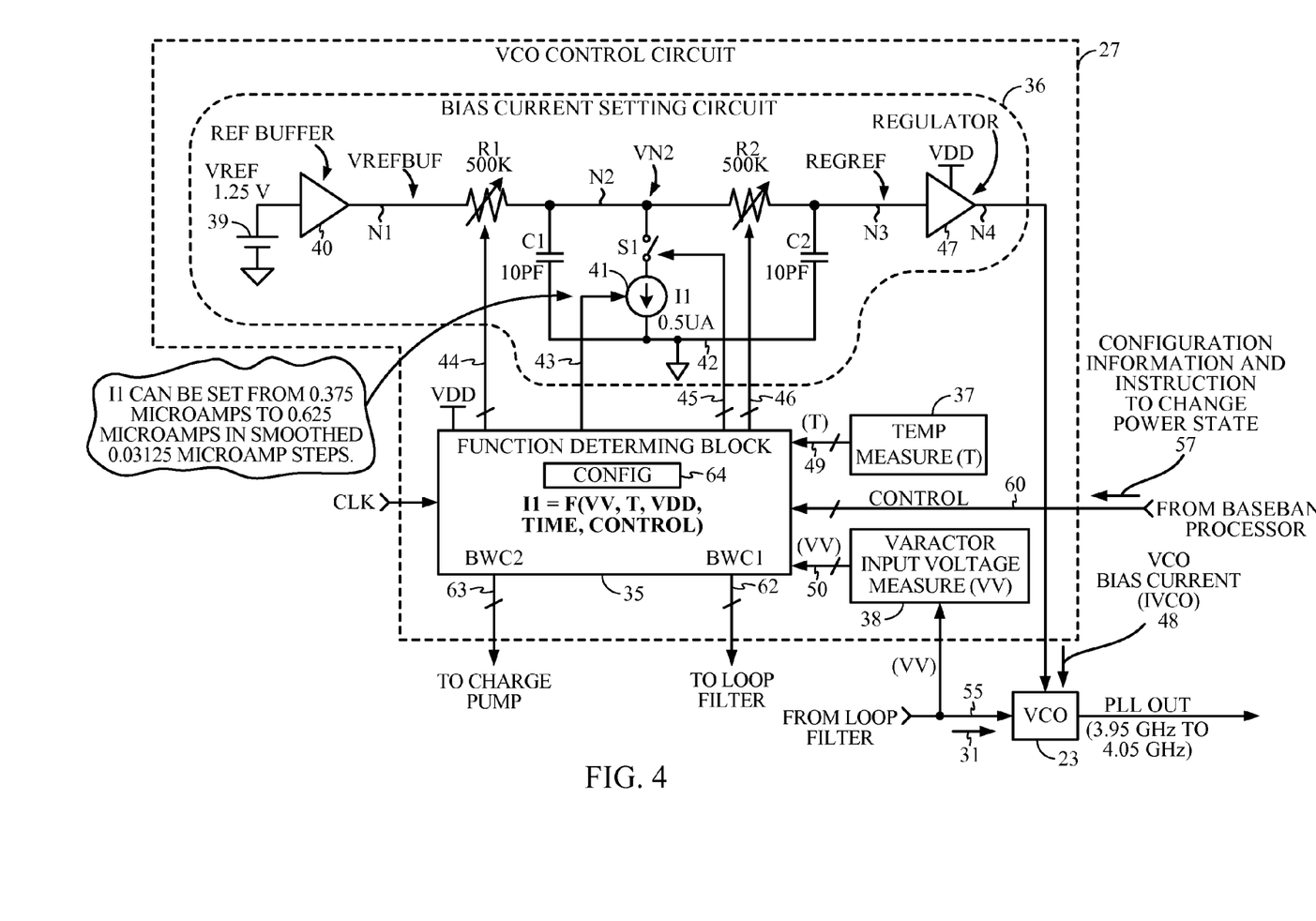
FIG. 4 is a more detailed circuit diagram of the VCO control circuit 27 of FIG. 3. The function determining block 35 of the VCO control circuit 27 may be realized as a digital state machine, as a digital processor that executes instructions, as an analog circuit, or as a combination of the above.

FIG. 4 is a more detailed diagram of one particular example of the VCO control circuit 27 of FIG. 3. VCO control circuit 27 includes a function determining block 35, a bias current setting circuit 36, a temperature measurement circuit 37, and a varactor input voltage measurement circuit 38.

Bias current setting circuit 36 includes a voltage reference 39 and a buffer 40. Buffer 40 drives node N1 so that a stable reference of 1.25 volts is present on node N1. If switch S1 is closed, then the voltage VN2 on node N2 is determined by the amount of current flowing from node N1, through resistor R1, through switch S1, and through current source 41, and to ground conductor 42. Current source 41 supplies a fixed current I1 that is set by function determining block 35 through conductor 43. Resistor R1 has a resistance that is set by function determining block 35 through conductors 44. Function determining block 35 can close or open switch SW1 using conductors 45. Current source 41 can be set to conduct a current having a magnitude from 0.375 microamperes to 0.625 microamperes, in steps of 0.03125 steps. Function determining block 35 can therefore, through control signals on conductors 43-45, set the magnitude of voltage VN2 within a range from approximately 1.06 volts to approximately 0.938 volts, in steps of 0.0156 volts. If function determining block 35 changes the current I1, the change in the voltage VN2 is smoothed by capacitor C1. The voltage VN2 is filtered by an RC low-pass filter comprising resistor R2 and capacitor C2. Function determining block 35 can set the value of resistor R2 through conductors 46. The resulting filtered voltage signal on node N3 is converted by a voltage-to-current regulator 47 into a VCO bias current (IVCO) 48. Function determining block 35 can therefore set the magnitude of the IVCO bias current 48 that is supplied to VCO 23.

Temperature measurement circuit 37 supplies a digital signal (T) indicative of the detected temperature across conductor or conductors 49 to function determining block 35. Varactor input voltage measurement circuit 38 receives the VCO input control signal 31 and supplies a digital signal (VV) indicative of the voltage magnitude of signal 31 to function determining block 35 across conductor or conductors 50.

Figure 5:
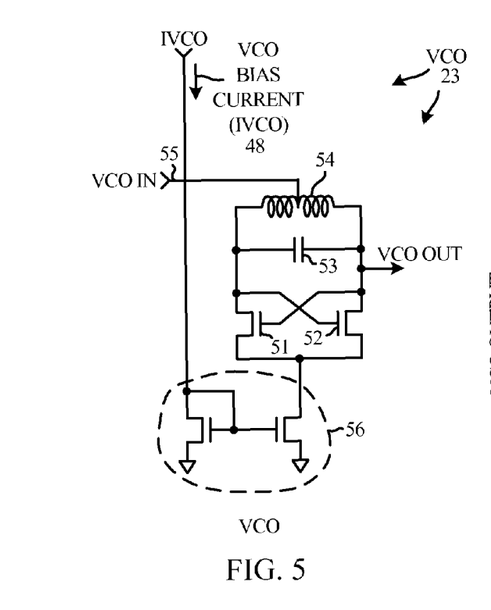
FIG. 5 is a circuit diagram showing one suitable circuit for realizing VCO 23 of FIG. 4.

FIG. 5 is a circuit diagram of one example of VCO 23. VCO 23 includes a pair of cross-coupled field effect transistors 51 and 52, and a resonant circuit including a varactor 53 and an inductor 54. VCO bias current (IVCO) 48 sets the current consumption of VCO 23 via current mirror 56.

Figure 6:
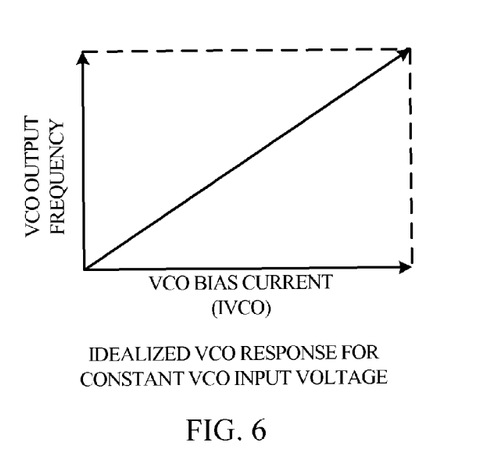
FIG. 6 is a chart showing, in simplified fashion, how the frequency of the VCO output signal changes as a function of the bias current supplied to the VCO, assuming that the voltage of the VCO input signal is constant.

FIG. 6 is a chart showing an idealized performance of VCO 23. The chart shows how the frequency of the VCO output signal VCO OUT changes as a function of VCO bias current 48, assuming that the voltage of VCO control input signal 31 is constant.

An operation of PLL 21 of local oscillator 6 of FIG. 3 is now explained in connection with the simplified waveform diagram of FIG. 7 and the method 100 set forth in the flowchart of FIG. 8. Initially, digital baseband IC 3 periodically or continuously monitors an RF channel condition. In the present example, the RF channel condition is the Signal-to-Noise Ratio (SNR) of received signal 7. In another example, the RF channel condition is the RSSI (Relative Signal Strength Indicator) of received signal 7. For a period of time, the SNR is below a predetermined value. The digital baseband IC 3 determines that the RF channel SNR is below the predetermined value, so digital baseband IC 3 does not change the power control instruction 57. VCO control circuit 27 continues to control VCO bias current 48 to have a high magnitude. In the example illustrated in FIG. 7, this high magnitude is the maximum 0.375 microampere amount. VCO 23 is therefore controlled to operate in its high power state. This period of operation is represented by reference numeral 58 in FIG. 7.

Next, digital baseband IC 3 detects that the SNR exceeds the predetermined value. In the present example, the SNR detected is excellent such that the VCO can be operated in its minimum power state. This detection occurs at time 59 in FIG. 7. Digital baseband IC 3 communicates an instruction 57 to change the power state to VCO control circuit 27 via control line or control lines 60. VCO control circuit 27 receives (step 101 of FIG. 8) the instruction to change power states and in response gradually widens (step 102 of FIG. 8) the loop bandwidth of the PLL control loop. The time during which the loop bandwidth is gradually widened is identified by numeral 61 in FIG. 7. In one example, the function determining block 35 within VCO control circuit 27 widens the loop bandwidth of the PLL by changing the resistance value of loop filter 26. The loop filter is an RC filter involving a capacitor and a digitally controlled variable resistor. The resistance of the variable resistor is decreased by multi-bit digital control signal BWC1 on conductors 62. In another example, the function determining block 35 within VCO control circuit 27 widens the loop bandwidth of the PLL by increasing a charge pump current within charge pump 25. Charge pump 25 includes a plurality of charge pump current sources. Which charge pumps are selected is determined by multi-bit digital control signal BWC2 on conductors 63. Increasing the charge pump current results in widening the loop bandwidth of the PLL.

Widening PLL loop bandwidth increases noise in the PLL OUT signal, but it also allows the PLL to recover faster from loop disruptions and perturbations. If PLL loop bandwidth were not widened, and if the VCO bias current were changed, then the PLL control loop may not be able to recover fast enough to loop perturbations due to changes in VCO bias current and the PLL may fall out of lock. Widening PLL loop bandwidth helps prevent the loop from falling out of lock when the VCO bias current is changed.

Next, starting at time 64, the function determining block 35 within VCO control circuit 27 gradually decreases the VCO bias current 48 (step 103 of FIG. 8) to decrease VCO power consumption. Function determining block 35 does this by stepping up current I1 supplied by current source 41. The result of stepping up current I1 is a stepping down of the voltage on nodes N2 and N3 and a stepping down of the VCO bias current 48 output by regulator 47. In one novel aspect, the function determining block 35 is a digital logic state machine that is clocked by a clock signal CLK. The function determining block 35 changes the current I1 at discrete times such that the current I1 is represented by the increasing stair step waveform illustrated in FIG. 7. The bias current IVCO 48 is changed slowly enough that the power state is changed from its maximum to its minimum in not less than ten microseconds. This time period is identified in FIG. 7 by reference numeral 65.

Once the VCO is operating in its low power state, the function determining block 35 within VCO control circuit 27 gradually narrows (step 104 of FIG. 8) the loop bandwidth of the PLL control loop. This gradual narrowing is the opposite of the widening of step 102 of FIG. 8 described above. The gradual narrowing may be carried out by increasing the resistance of the resistor in the RC loop filter 26 and/or by decreasing the charge pump current within charge pump 25. Reference numeral 66 in FIG. 7 identifies the time period over which the loop bandwidth of the PLL is narrowed. As indicated by the caption to the left of FIG. 8, then entire process of widening the PLL loop bandwidth, gradually changing VCO power, and then narrowing the PLL loop bandwidth again occurs without the PLL 21 falling out of lock.

Figure 7:
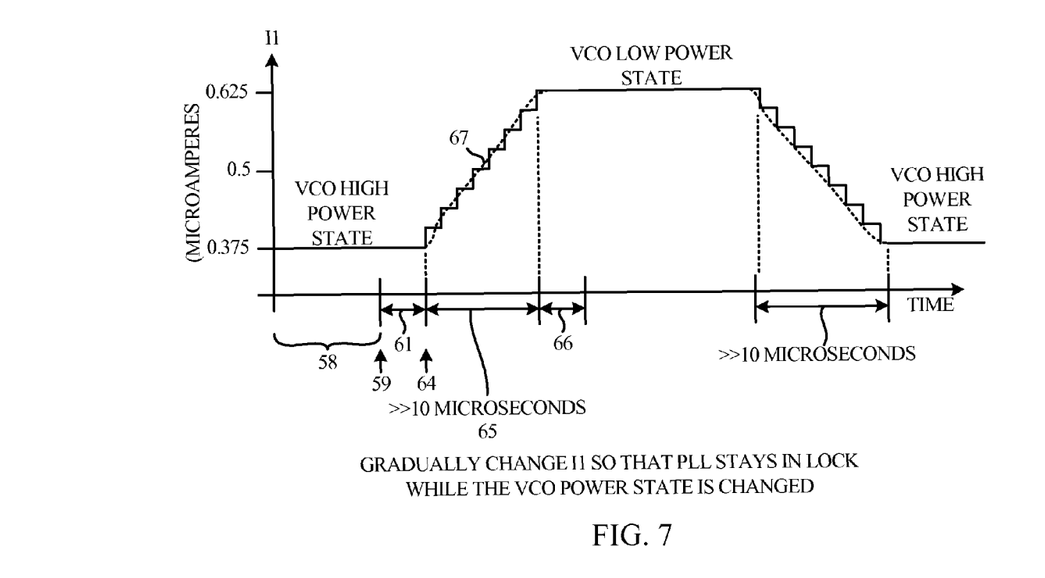
FIG. 7 is a simplified waveform diagram that illustrates a novel method involving the local oscillator 6 of FIG. 3.
Figure 8:
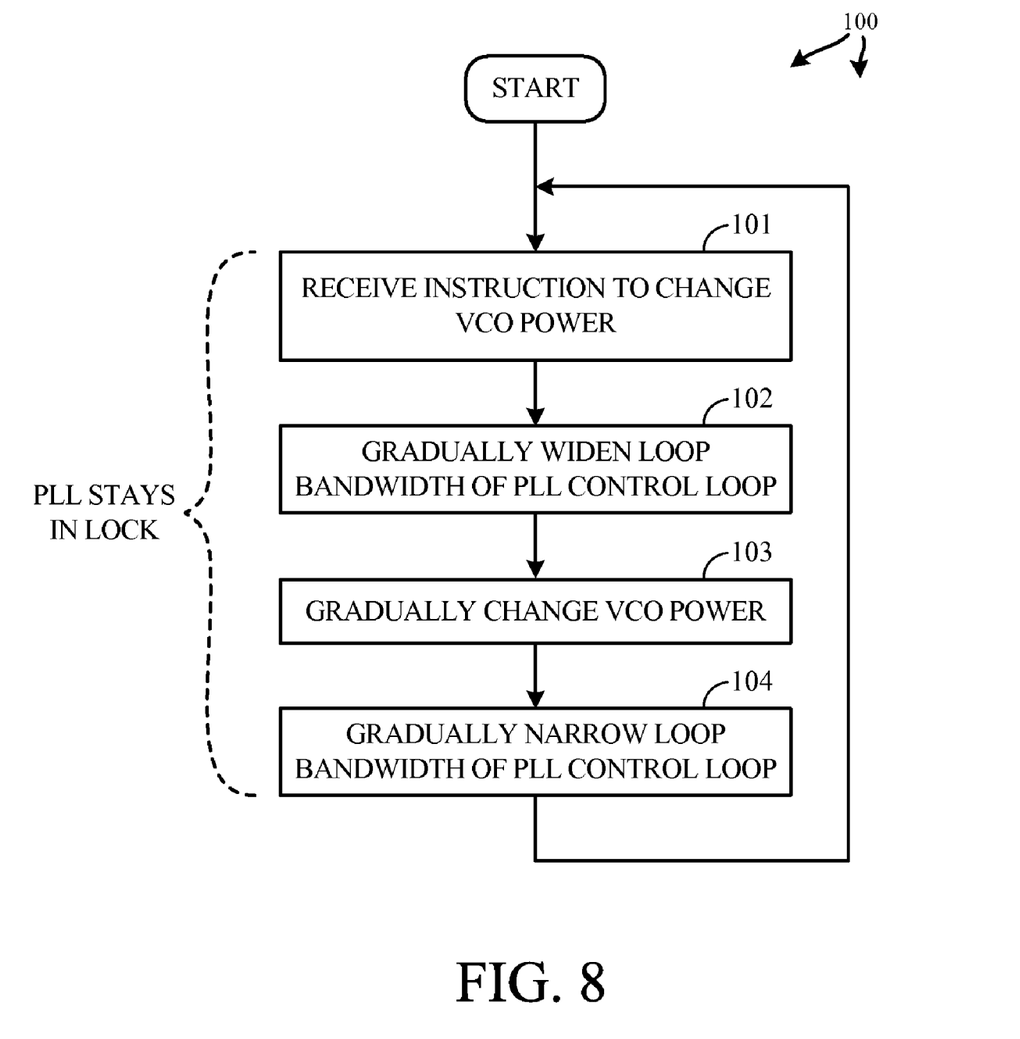
FIG. 8 is a flowchart that illustrates steps in the novel method set forth in the waveform diagram of FIG. 7.

Although the example of FIG. 7 involves decreasing the power state of the VCO, the VCO could initially have been operating in a low power state and the instruction 57 could have been to increase the power state of the VCO. Although the VCO power state is shown in FIG. 7 changing between its minimum and maximum values, this example is presented only for illustrative purposes. In a real operating example, the VCO power state can be controlled to change from or to a power level other than the minimum VCO power or the maximum VCO power. In one embodiment of the VCO control circuit 27, the capacitor C1 is sized such that the steps in the voltage VN2 on node N2 are smoothed and the voltage VN2 on node N2 appears as indicated by dashed line 67.

In one example, the impetus for changing the power state of the VCO is not an instruction from digital baseband IC 3, but rather is a determination to center the voltage of the signal 31 on VCO input lead 55. The result may be to center the voltage of signal 31 within an operating range, or may be to move the voltage closer to the center. Varactor input voltage measurement circuit 38 detects and digitizes the voltage on lead 55 and supplies the resulting digital value VV via conductors 50 to function determining block 35. Digital value VV is indicative of the magnitude of the voltage of signal 31. If the function determining block 35 is configured to enable this centering function, and if the detected voltage on lead 55 as detected falls below a minimum limit or rises above a maximum limit, then function determining block 35 changes the power state of the VCO so as to make the VCO input voltage closer to the center of the operating voltage range of signal 31. In one example, the operating voltage range of signal 31 is from 0.5 volts to 1.0 volts. A VCO input voltage of 0.50 volts corresponds to a PLL OUT (VCO output signal) frequency of approximately 4.05 GHz; a VCO input voltage of 0.75 volts corresponds to a PLL OUT (VCO output signal) frequency of approximately 4.00 GHz; and a VCO input voltage of 1.00 volts corresponds to a PLL OUT (VCO output signal) frequency of approximately 3.95 GHz. The minimum and maximum limits are approximately 0.6 volts and approximately 0.9 volts, respectively. By centering the VCO input voltage, the varactor within the VCO may have more margin for staying within the operating voltage range when temperature changes change the capacitance of the varactor.

In one example, function determining block 35 is a digital state machine or digital processor that changes the current I1 as a function of many input variables including the detected varactor voltage, the detected temperature, the supply voltage VDD, time, configuration information, and the instruction 57 to change power state as received from digital baseband integrated circuit 3. In addition to controlling the current source control signal on conductors 43, function determining block 35 controls the control signals on conductors 44, 45, 46, 62 and 63 in accordance with the function. If the supply voltage is detected to decrease beyond a predetermined low battery voltage level, then the function determining block decreases VCO power and sacrifices some PLL performance in order to extend battery life more than were the VCO power maintained at its optimal VCO power state.

In one example, the VCO is characterized over temperature to determine how the VCO OUT frequency changes as a function of temperature, how the VCO OUT frequency changes as a function of VDD, and how the VCO OUT frequency changes as a function of VCO bias current. The function determining block 35 then adjusts the VCO bias current 48 in order to compensate for detected temperature changes and detected supply voltage VDD changes. The configuration information may include enable bits that enable or disable certain aspects of the overall function that determines VCO bias current IVCO. The configuration information is written into one or more configuration registers 64. For example, one bit may open or close switch SW1. One bit may enable or disable the VCO input voltage centering function. One bit may enable or disable the temperature compensation function. Bits may determine which ones of BWC1 and BWC2 is/are used to widen and narrow the PLL loop bandwidth, and other sets of bits may determine how fast the loop bandwidth is changed. Bits may determine the values of the signals on conductors 44 and 46. Other bits may determine how fast the VCO bias current is changed. The configuration bits stored in configuration registers 64 may be changed as the mobile communication device 1 is being used. Function determining block 35 may be able to implement multiple different functions for determining current I1. Bits stored in configuration registers 64 may determine which one of the possible functions is being used.

Although certain specific embodiments are described above for instructional purposes, the teachings of this patent document have general applicability and are not limited to the specific embodiments described above. Although the novel VCO control circuit is disclosed in connection with an analog phase-locked loop, the VCO control circuit teachings disclosed in this patent document are extendable to use with a digitally phase-locked loop and a digitally controlled oscillator (DCO). Accordingly, various modifications, adaptations, and combinations of the various features of the described specific embodiments can be practiced without departing from the scope of the claims that are set forth below.

What is claimed is:

1. A method comprising:
receiving an instruction to change a power state of a voltage controlled oscillator (VCO) of a locked phase-locked loop (PLL) within a local oscillator, wherein the local oscillator is part of an RF communication device, wherein the PLL has a loop bandwidth, and wherein a bias current is supplied to the VCO;
widening the loop bandwidth of the locked PLL in response to receiving the instruction;
changing the bias current supplied to the VCO after widening the loop bandwidth of the locked PLL;
narrowing the loop bandwidth of the locked PLL after changing the bias current supplied to the VCO; and
detecting an input voltage supplied to the VCO, wherein the bias current supplied to the VCO is a function of at least the detected input voltage and the instruction.

2. The method of claim 1, wherein the bias current is changed in five or more steps.

3. The method of claim 1, wherein the bias current is changed over a period of more than ten microseconds, wherein the RF communication device is a cellular telephone, and wherein the VCO outputs a signal having a frequency greater than one gigahertz.

4. The method of claim 1, further comprising:
communicating configuration information to a VCO control circuit, wherein the VCO control circuit supplies the bias current to the VCO and wherein configuration information determines at least in part how the VCO control circuit changes the bias current supplied to the VCO.

5. The method of claim 4, wherein the configuration information includes the received instruction.

6. The method of claim 4, further comprising:
receiving a digital clock signal into the VCO control circuit, wherein the VCO control circuit uses the digital clock signal to control a timing of the changing of the bias current supplied to the VCO.

7. A method comprising:
receiving an instruction to change a power state of a voltage controlled oscillator (VCO) of a locked phase-locked loop (PLL) within a local oscillator, wherein the local oscillator is part of an RF communication device, wherein the PLL has a loop bandwidth, and wherein a bias current is supplied to the VCO;
widening the loop bandwidth of the locked PLL in response to receiving the instruction;
changing the bias current supplied to the VCO after widening the loop bandwidth of the locked PLL;
narrowing the loop bandwidth of the locked PLL after changing the bias current supplied to the VCO; and
detecting a temperature, wherein the bias current supplied to the VCO is a function of at least the temperature and the instruction.

8. The method of claim 7, wherein the bias current is changed in five or more steps.

9. The method of claim 7, wherein:
the bias current is changed over a period of more than ten microseconds;
the RF communication device is a cellular telephone; and
the VCO outputs a signal having a frequency greater than one gigahertz.

10. The method of claim 7, further comprising communicating configuration information to a VCO control circuit, wherein:
the VCO control circuit supplies the bias current to the VCO; and
the configuration information determines at least in part how the VCO control circuit changes the bias current supplied to the VCO.

11. The method of claim 10, wherein the configuration information includes the received instruction.

12. The method of claim 10, further comprising:
receiving a digital clock signal into the VCO control circuit, wherein the VCO control circuit uses the digital clock signal to control a timing of the changing of the bias current supplied to the VCO.

13. A phase-locked loop (PLL) comprising:
a voltage controlled oscillator (VCO) that receives a VCO bias current;
a VCO control circuit, wherein the VCO control circuit outputs the VCO bias current and also outputs a signal that controls a loop bandwidth of the PLL, wherein the loop bandwidth of the PLL is widened prior to changing the VCO bias current and narrowed after the VCO bias current is changed, and wherein the PLL is part of a mobile RF communication device; and a loop filter, wherein the loop filter supplies a voltage signal to the VCO, and wherein the VCO control circuit receives the voltage signal and controls the VCO bias current at least in part based on the voltage signal.

14. The PLL of claim 13, wherein the VCO control circuit changes the VCO bias current smoothly from a first VCO bias current value to a second VCO bias current value over a period of at least ten microseconds such that the PLL remains locked.

15. The PLL of claim 13, wherein the VCO control circuit receives an instruction to change a power state of the VCO.

16. The PLL of claim 13, wherein the signal that controls the loop bandwidth of the PLL is supplied by the VCO control circuit to the loop filter.

17. The PLL of claim 13, further comprising:

a charge pump, wherein the signal that controls the loop bandwidth of the PLL is supplied by the VCO control circuit to the charge pump.

18. A phase-locked loop (PLL) of a local oscillator of an RF communication device, the PLL comprising:

a voltage controlled oscillator (VCO) that receives a VCO bias current;

means for receiving an instruction to change a power state of the VCO;

means for widening a loop bandwidth of the PLL, then for changing the VCO bias current smoothly from a first VCO bias current value to a second VCO bias current value over a period of at least ten microseconds, and then for narrowing the loop bandwidth of the PLL, wherein said changing of the VCO bias current occurs without the PLL falling out of lock; and means for detecting an input voltage supplied to the VCO, wherein the VCO bias current supplied to the VCO is a function of at least the detected input voltage and the instruction.

19. The PLL of claim 18, wherein the means for widening a loop bandwidth is configurable by writing digital configuration information into the means.

20. A method comprising:

detecting a voltage controlled oscillator (VCO) input voltage supplied to a VCO, wherein the VCO includes a varactor and wherein the VCO is a part of a locked phase-locked loop (PLL) within a local oscillator of an RF communication device; and changing a bias current supplied to the VCO based on detecting the VCO input voltage, wherein changing the bias current of the VCO involves:
widening a loop bandwidth of the PLL;
changing the bias current supplied to the VCO after the widening of the loop bandwidth; and
narrowing the loop bandwidth of the PLL.

21. The method of claim 20, further comprising:

determining whether the detected VCO input voltage is close to an input voltage limit of an input voltage range, and changing the bias current of the VCO such that the VCO input voltage is centered in the range, if the detected VCO input voltage is determined to be close to the input voltage limit of the input voltage range.

22. The method of claim 20, further comprising:

detecting a temperature, wherein the bias current is changed as a function of both the detected VCO input voltage and the detected temperature.

23. The method of claim 20, wherein changing the bias current of the VCO includes receiving a clock signal, and using the clock signal to change the bias current.

24. The method of claim 20 wherein the bias current supplied to the VCO is changed in five or more steps.

25. The method of claim 20, further comprising:

determining an RF channel condition and based at least in part on said determined RF channel condition determining that a power state of the VCO should be changed, wherein the bias current is changed in response to determining that the power state of the VCO should be changed.

26. The method of claim 25, wherein the RF channel condition is taken from the group consisting of: a signal-to-noise ratio (SNR) value, and a received signal strength indicator (RSSI) value.

27. The method of claim 20, wherein a VCO control circuit supplies a control signal to a loop filter in the PLL, detects the VCO input voltage and changes the bias current.

28. An RF communication device having a local oscillator, the communication device comprising:

means for receiving an instruction to change a power state of a voltage controlled oscillator (VCO) of a locked phase-locked loop (PLL) within the local oscillator, wherein the PLL has a loop bandwidth;

means for supplying a bias current the VCO;

means for widening the loop bandwidth of the locked PLL in response to receiving the instruction;

means for changing the bias current supplied to the VCO after widening the loop bandwidth of the locked PLL;

means for narrowing the loop bandwidth of the locked PLL after changing the bias current supplied to the VCO; and means for detecting an input voltage supplied to the VCO, wherein the bias current supplied to the VCO is a function of at least the detected input voltage and the instruction.

29. The communication device of claim 28, wherein means for changing the bias current supplied to the VCO includes means for changing the bias current in five or more steps.

30. The communication device of claim 28, wherein:

means for changing the bias current includes means for changing the bias current over a period of more than ten microseconds;

the RF communication device is a cellular telephone; and the VCO outputs a signal having a frequency greater than one gigahertz.

31. The communication device of claim 28, further comprising means for communicating configuration information to a VCO control circuit, wherein:

the VCO control circuit supplies the bias current to the VCO; and the configuration information determines at least in part how the VCO control circuit changes the bias current supplied to the VCO.

32. The communication device of claim 31, wherein the configuration information includes the received instruction.

33. The communication device of claim 31, wherein means for changing the bias current supplied to the VCO includes means for changing the bias current according to a timing based on a digital clock signal.

34. An RF communication device having a local oscillator, the communication device comprising:
  means for receiving an instruction to change a power state of a voltage controlled oscillator (VCO) of a locked phase-locked loop (PLL) within the local oscillator, wherein the PLL has a loop bandwidth;
  means for supplying a bias current the VCO;
  means for widening the loop bandwidth of the locked PLL in response to receiving the instruction;
  means for changing the bias current supplied to the VCO after widening the loop bandwidth of the locked PLL;
  means for narrowing the loop bandwidth of the locked PLL after changing the bias current supplied to the VCO; and
  means for detecting a temperature, wherein the bias current supplied to the VCO is a function of at least the temperature and the instruction.

35. The communication device of claim 34, wherein means for changing the bias current supplied to the VCO includes means for changing the bias current in five or more steps.

36. The communication device of claim 34, wherein:
  means for changing the bias current includes means for changing the bias current over a period of more than ten microseconds;
  the RF communication device is a cellular telephone; and
  the VCO outputs a signal having a frequency greater than one gigahertz.

37. The communication device of claim 34, further comprising means for communicating configuration information to a VCO control circuit, wherein:
  the VCO control circuit supplies the bias current to the VCO; and
  the configuration information determines at least in part how the VCO control circuit changes the bias current supplied to the VCO.

38. The communication device of claim 37, wherein the configuration information includes the received instruction.

39. The communication device of claim 37, wherein means for changing the bias current supplied to the VCO includes means for changing the bias current according to a timing based on a digital clock signal.

* * * * *